United States Patent [19]

Vogt et al.

[11] 4,198,620
[45] Apr. 15, 1980

[54] REMOTE CONTROL RECEIVER

[75] Inventors: Alfred Vogt, Salz; Bernd Veith, Bad Neustadt; Anton Rüttiger, Oberbach, all of Fed. Rep. of Germany

[73] Assignee: Preh, Elektrofeinmechanische Werke, Jakob Preh Nachf GmbH & Co., Fed. Rep. of Germany

[21] Appl. No.: 934,617

[22] Filed: Aug. 17, 1978

[30] Foreign Application Priority Data

Aug. 25, 1977 [DE] Fed. Rep. of Germany ....... 2738414

[51] Int. Cl.$^2$ .............................................. H04Q 9/12
[52] U.S. Cl. ........................ 340/171 PF; 340/171 R; 340/148
[58] Field of Search ........ 340/171 R, 171 PF, 171 A, 340/148; 358/194

[56] References Cited

U.S. PATENT DOCUMENTS 3,893,074  7/1975  Mogi .............................. 340/171 PF Primary Examiner—Harold I. Pitts
Attorney, Agent, or Firm—Thomas E. Beall, Jr.

[57] ABSTRACT

Apparatus for receiving remote control signals which comprise an alternating sequence of two chronologically successive pulses, the first pulse having a first predetermined frequency and the second pulse having a second frequency manually selected from a predetermined number of frequencies, each of the predetermined number of frequencies representing a command to be carried out. The receiver comprises a signal detector, a signal amplifier and a circuit for decoding the remote control signal into a group signal dependent on the first frequency and a command signal dependent on the second frequency. A controllable gate is provided for gating the command signal from the decoding circuit to a command signal register having a command signal input for each of the commands, and an input for blocking each command signal output. Means coupled to the command signal outputs implement the commands. A circuit responsive to the group signal controls the gate, while a circuit responsive to receipt of a command signal in the register causes the remaining command signal inputs to be locked.

17 Claims, 4 Drawing Figures

REMOTE CONTROL RECEIVER

BACKGROUND OF THE INVENTION

1. Field of the Invention

The invention relates to a remote control receiver.

2. The Prior Art

Wireless remote control devices have long been used for distant control of movable objects such as cranes, locomotives, model aircrafts, or toy cars. Such devices are also used with apparatus of the entertainment industry, especially apparatus with increased operating comfort, the different continuously variable adjustments such as sound volume, contrast, color intensity, brightness, and the adjustments variable in discrete steps such as the sender finder, and the station selection, being through wireless remote control. An ultrasonic signal is emitted from a transmitter and is converted into a control signal corresponding to the selected frequency in a receiver section. Besides ultrasonic signals, infrared signals are also used for remote control.

With the use of ultrasonic, different processes are already known. The simplest process is that for each adjustment a special channel with its associated frequency is assigned for characterizing of the kind of adjustment. With a continuously variable adjustment, mostly two frequencies are necessary for changing of the adjustment; that is, a frequency for the increase and a frequency for the decrease of the adjustment. The amount of the desired change is fixed by the duration of pushing an input key. On the receiver side for recognition of the different frequencies, a number of resonant circuits is used corresponding to the number of different frequencies, which makes necessary a time-consuming calibration before putting the receiver into service.

With modern remote control systems using integrated circuit networks, the arriving ultrasonic frequencies are converted into pulses, the pulse repetition frequency of which is equal to the ultrasonic frequency. The pulses received during a fixed time limit are counted in a counter and evaluated. Another known method is the pulse code method. Here, a coded pulse sequence is emitted from the transmitter and decoded in the receiver. This principle has the disadvantage that it is relatively expensive to construct the sender as well as the receiver. A further disadvantage is the poor freedom from interference such that especially at the border of the service radius, or with a weakened transmitter battery, false operation can occur.

With the use of ultrasonic signals there is the disadvantage that interference can occur in the transmission path such that the received ultrasonic oscillations do not correspond with those transmitted, and therefore false operations are produced. These interferences can consist in that, for example, the transmitted ultrasonic oscillations are superposed with ultrasonic oscillations reflected in the room and therefore cancelled. In addition, the ultasonic-wave components of extraneous noises such as key rattling, ringing of a telephone, or the sweep radiations of the horizontal line scan of a television receiver, or other interference sources, such as ultrasonic washing plants or the simultaneous operation of several ultrasonic remote controllers, can produce a false operation. Relatively expensive circuits and transmitting methods have been developed to prevent such false operations.

A remote control device is already known in which a sending oscillator is switched on or off in synchronism with the pulses to be transmitted, and in which the signal generator (transmitter) is a mechanical structure capable of oscillating, that is, a loud speaker, which decays after switching-off the sending oscillator. If it is stimulated for a short time at its resonant frequency, however, uncontrollable oscillations occur which can lead to false operations. Similar difficulties result with the use of receiver microphones which likewise consist of a mechanically oscillating structure. To suppress the influence of the interference oscillations when switching the sending oscillator on and off, it has been proposed to send a first frequency as desired frequency during the pulse duration, and a second frequency as auxiliary frequency during the spacing intervals between the pulses of the first frequency, such that the auxiliary frequency is sent after the last pulse until the receiver is no longer ready to receive, or such that the amplitude of the auxiliary frequency sent after the last pulse is continuously but slowly decreased until no further oscillations containing the desired frequency are produced. A pulse generator producing a pulse sequence is provided which switches the auxiliary frequency on or off with an electronic circuit. From this follows that the sending oscillator oscillates with the desired frequency during the pulse duration instead of with the auxiliary frequency. The number of pulses which are produced by the pulse generator depends upon which one of the keys connected with the pulse generator is operated. The desired frequency is separated from the auxiliary frequency by a resonant circuit in the receiver. A monitoring circuit recognizes whether a desired pulse has been received. If the monitoring circuit recognizes a desired pulse at the beginning of the remote control signal, a monostable sweep stage is triggered. The output of the sweep stage is connected with an electronic switch which then releases the receiver for evaluation. The duration of the astable ON-condition of the sweep stage is chosen such that the circuit is open as long as the transmission of the maximum possible number of pulses lasts. It is disadvantageous with this remote control device that no further operation channel may lie between the auxiliary and desired frequencies, because the oscillator frequency covers the complete range lying between the auxiliary frequency and the desired frequency when the frequency is switched.

Further, an ultrasonic remote control with pulse modulation is known for television sets, in which the ultrasonic signal is composed of two chronologically successive frequencies which are coded in their value and in their respective duration. The frequency of the first ultrasonic tone determines the kind of information, whether, for example, a channel shall be selected or a level shall be changed, while the duration of the first ultrasonic tone fixes the channel number or the kind and direction of the level change. Only the second ultrasonic tone initiates the execution of the command stored previously; its duration controls in digital steps the magnitude of the level change. The ultrasonic signal is amplified in the receiver, limited, filtered, and then converted into direct current signals. Multivibrators are switched on or off by the ultrasonic signal, and produce pulses with an exactly defined period during the intervals that they are switched on. These pulses are evaluated in decadic forward and backward ring counters. Connected to their outputs are additional dircuits wich pass on to the stages to be controlled the digital commands, either directly or converted into analogue value. It is disadvantageous with this remote control device that reverberation effects make an exact evaluation of the transmitted frequency packages impossible.

To avoid false operations caused by interference noises, a remote control arrangement is already known wherein shortly before the actual desired signal a pre-pulse with a longer pulse duration than the desired pulse is sent. The desired signals consist of pulse groups which have a different number of desired pulses according to the television program desired. The transmission takes place in a transmission channel such that a carrier frequency is keyed on and off in the rhythm of the pulses. An evaluation circuit is provided in the receiver which checks whether the received signal contains a pre-pulse at the beginning. The duration of this pre-pulse is long enough that it cannot be simulated by interference signals. Upon recognition of a pre-pulse, a monostable sweep circuit is set, its output controlling the current conduction of an electronic switch. The duration of ON-connections of the monostable sweep circuit is sufficiently long that the maximum possible number of desired pulses can pass through the electronic switch. It is disadvantageous that with short desired pulses the circuit conducts current, so that interferences can trigger false operations. To avoid this disadvantage, it has been proposed to control the monostable sweep circuit with a trigger circuit. The timing element determining the duration of ON-connection of the monostable sweep stage is controlled, that is, reset, when a signal appears at the output of the trigger circuit. The duration of the monostable state is chosen to be smaller than the duration of the longest possible desired signal.

Further, an arrangement for wireless remote control using ultrasonic for plural devices is known which can be remote-controlled by a common transmitter, or by plural transmitters independent of one another. This arrangement is intended for the case when a television set and a stereo receiving device are to be operated in the same room. Because the number of available frequencies is limited, it has been proposed to transmit for each independently controlled receiver an additional identification frequency simultaneously with or interposed in a predetermined way with the unmodulated command frequency. The respective ultrasonic receiver thus reacts only if it receives its own identification frequency in addition to the command frequency. The remaining receivers having identical command frequencies but a different identification frequency are not addressed. If the range of the available ultrasonic frequencies is not sufficient for additional identification frequencies, it has been proposed to use no identification frequency for the first receiver, and to use a command frequency of the first receiver as identification frequency for the further receivers, so that the first receiver does not react if this frequency is received together, or interposed in a predetermined way, with the other command frequency. On the receiver side, resonant circuits are present, for each identification frequency, which make necessary a time-consuming calibration process before placing the device in service. It is further disadvantageous that upon interruption of the ultrasonic signal after the identification frequency, for half a period duration of the ultrasonic signal, a false operation can be triggered by interference frequencies.

SUMMARY OF THE INVENTION

It is the object of the invention to avoid these disadvantages, and to find a simple circuit for a remote control receiver of the aforementioned kind wherein the freedom of interference is improved even with brief interruptions of the transmission, and wherein false operations, which may briefly occur at the beginning, during interruption, or at the end of the transmitted command, are prevented.

This problem is solved by the invention in that the outputs of a command-signal register consisting of retriggerable, monostable sweep circuits, which cooperate with command implementing elements, act through a locking circuit on blocking inputs of the command-signal register such that, as soon as a command is stored in one of the monostable sweep circuits, all inputs of the remaining monostable sweep circuits are blocked; and in that an additional retriggerable, monostable sweep circuit is provided which is controlled by a group signal produced by a decoding circuit from a first frequency in the receiving pulse sequence, and the output of which works upon blocking inputs of the command register, upon the locking circuit, and upon an element for inhibiting and enabling the command in implementing elements.

BRIEF DESCRIPTION OF THE DRAWINGS

A detailed description of the preferred embodiments follows below with reference to the drawings, in which.

THE PREFERRED EMBODIMENT

Figure 1:
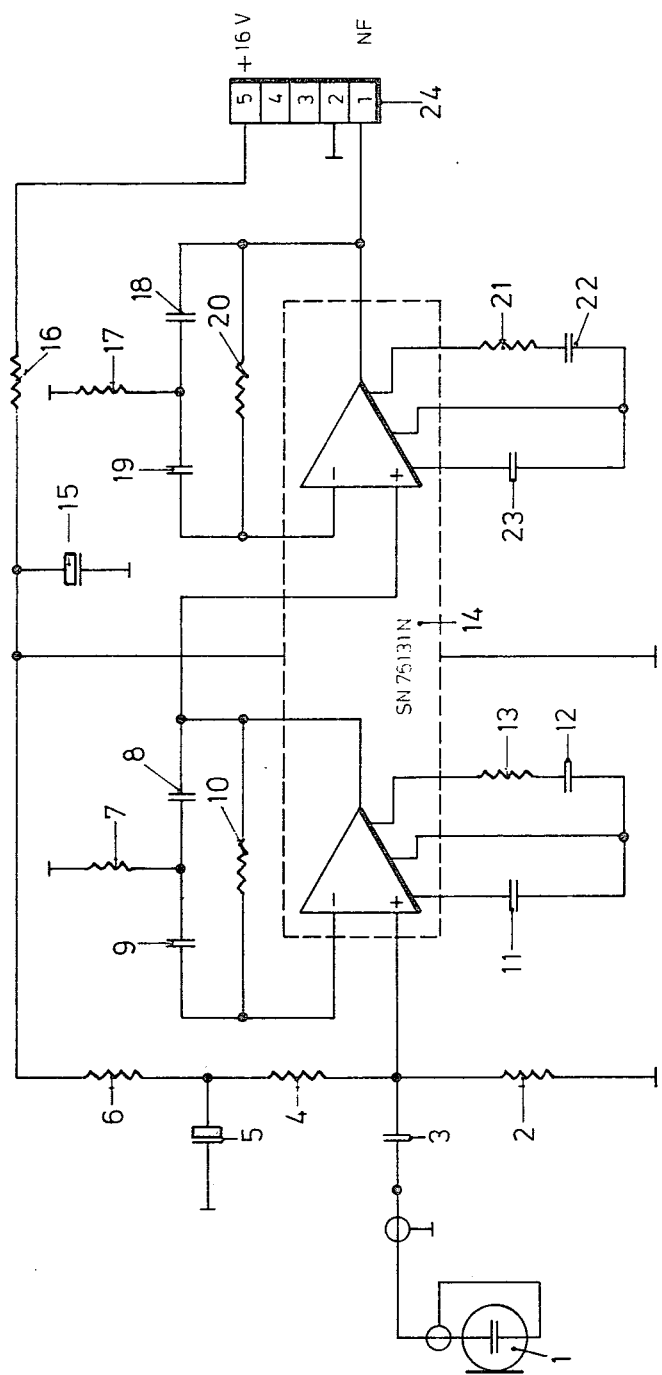
FIG. 1 shows a circuit diagram of a pre-amplifier in the receiver.

Ultrasonic signals emitted from a transmitter are received by an electret condensor microphone 1, for which no polarization voltage is necessary, and are led by a capacitor 3 to an active band pass filter. As can be seen from FIG. 1, a circuit network 14 (type Ser. No. 76131N) comprising two operational amplifiers forms the core of the band-pass filter amplifier. Each operational amplifier is feedback coupled with an RC-network such that two narrow-band filters result which yield the function of the band-pass filter when coupled in series. The RC-network of the first operational amplifier consists of two capacitors 8 and 9 and resistors 7 and 10. The RC-network of the second operational amplifier is formed of two capacitors 18 and 19 and two resistors 17 and 20.

In the embodiment of the remote control receiver described here, the frequency of the first pulse represents the identification frequency (also called group frequency), and the frequency of the second pulse represents the command frequency. If interferences occur through reflections of the transmitting frequency which decrease the level of the command frequency compared to that of the group frequency at the receiver microphone by −3dB, and if during this condition an ultrasonic interference source is received which lies in the input level between the group and selected command frequencies, this interference signal will be suppressed by the group frequency, but the selected command frequency will be suppressed and superposed by the interference. Because the group frequency occurs in each period of frequency reversal for the duration of T/2 (one half of the period), the group and the interference command signals alternately enter the evaluation circuit. This, a false function is performed in the above described condition of the transmission system by the interference command frequency. Interference commands can also occur in this manner when the level of the group frequency declines by 3 dB within the complete transmission system. The frequency response of the complete transmission system is composed of the characteristic curve of sender, receiver, and of the transmission path from sender to receiver. Tests have shown that false operations are suppressed suffieciently if in the complete transmission system the command frequencies are amplified 3 to 6 dB higher, depending upon the required freedom from interference, than the group frequencies. From this results a signal-to-noise ratio of 6 to 9 dB, which prevents false functions resulting from interferences or a decrease in level of the command frequency during simultaneous reception of an interfering frequency. Thus, it is assumed that with increasing sound level from such an interfacing source, as well as with reflection effects of the transmission frequencies, the group frequency is always suppressed first. The command output of the evaluation circuit is thereby interrupted and blocked. Because the absorption of the ultrasonic signal in the air increases with increasing frequency, the use of the highest frequency provided in the system as group frequency is expedient. The increase of the command frequency level occurs by corresponding dimensioning of the band-pass filter amplifier. At the not-inverted input of the first operational amplifier a voltage divider, consisting of the resistors 2,4, and 6, is provided for the working point adjustment of the complete integrated circuit network. The connection between resistors 4 and 6 is coupled to ground by a capacitor 5 for smoothing of the supply voltage.

Compensating resistor 16 and capacitor 15 also serve to suppress interferences which may be coupled to the power supply. For compensation of the frequency response, each operational amplifier is connected with external capacitors 11 and 12, or 22 and 23 respectively, and external resistors 13 or 21, respectively. Because the pre-amplifier is spaced apart from the remaining receiver circuit, the interconnection is made by a shielded, mult-conductor cable, the wires of which are connected to junctions 1, 2, and 5 of a junction block 24 at one side of the pre-amplifier. On one side of the remaining receiver circuit, the wires are connected to corresponding junctions of the junction block 25.

Line voltage is connected to the junctions of junction block 33, which leads over a safety fuse 32 to a transformer 31. The 24-volt alternating current from the secondary winding is rectified in the rectifier bridge 30 and led to an integrated voltage regulator 37 over a resistor 38 and over a charging condensor 39 coupled to ground. The voltage regulator is preferably a monolithic integrated unit TDB 7815 T, which has thermic overload protection, short circuit current limitation, and protection of the output transistor. The manufacturer gives the minimum output voltage as 14.4 V, and the maximum output voltage as 15.6V. The signal decoding module 44 coupled at the output requires a supply voltage of from 15 V minimum to 18 V maximum. To ensure that the decoding module is supplied with its minimum required voltage of 15 V when the minimum output voltage of 14.4 V is present, the output voltage is raised by 0.7 V. This is achieved by connecting the voltage regulator 37 with a resistor 36 and a diode 55, the cathode of which is coupled to ground. The resistor 36 is coupled to junction 5 of junction block 25 by a further protection resistor 34. Condenser 35 serves to filter the direct voltage supplied at junction 5.

To lead the direct voltage from the rectifier bridge 30 to the voltage regulator, two working contacts of a relay 29 must be closed. For this, normally-open key 40 must be pushed. Voltage is supplied to relay 29 through protection resistor 26 and rectifier diode 27 such that it is energized and the working contact close. One working contact is situated between the rectifier bridge and the voltage regulator. The second working contact serves to maintain the connection of the alternating current voltage when key 40 is released. Thus, the voltage from junction 8 is always supplied to the relay through the second working contact, the resistor 26, and the rectifier diode 27, such that the relay holds itself. If normally-closed key 41 is pushed, the voltage for the relay is interrupted and the working contacts are opened. Condensor 28 also serves to filter the direct voltage to the relay coil.

The core of the remote control receiver is a monolithic integrated decoding nodule 44 of type TSM 3700 NS, which is constructed in PMOS-technology. Module 44 decodes up to 20 ultrasonic frequencies in the range of 33.635 kHz to 43.448 kHz. An evaluation cycle is approximately 25 msec. If the received remote control signal alternates between group frequency and command frequency every 50 msec., 50 msec. is available for the recognition of each transmitted frequency. This time is sufficiently large as to avoid interferences which are caused by reverberation of the ultrasonic signals. Within the evaluation cycle it is repeatedly tested whether the applied frequency is constant within the band width of a channel. If this test is positive, the output corresponding to the receiver frequency is switched to ground at the end of the cycle. After the operation, interruptions or interferences of false frequency of smaller than 5 msec. do not influence the result. With longer lasting interferences, the unit switches off after a maximum of 11 msec. so that frequencies lying outside of the service band do not lead to operation of a command. If they dominate in amplitude compared with a simultaneously present desired frequency, the evaluation is interrupted. Because a program counter is provided in the unit, an external oscillator is necessary for frequency production. This consists of a crystal 48 and of a passive feedback network for working point adjustment which is constructed of capacitors 46 and 49, and resistor 47.

The received ultrasonic frequency is amplified in the preamplifier and led as an electrical signal over junction 1 of the junction block 24, and over the connecting cable to the junction 1 of junction block 25. From there the signal passes to the input of decoding module 44 (terminal 1) through a protection resistor 42 and a coupling condensor 43. The external oscillator is connected to terminals 22 and 23 of the decoding module. The integrated decoding circuit module is provided with power at junctions 10 (supply voltage) and 24 (ground). Terminals 2–9 and 11–21 represent outputs. The correlation of the commands to the output terminals and the command frequencies is given in the following table:

| Command | Terminal | Center Frequency (kHz) |
| --- | --- | --- |
| 1 | 12 | 33.826 |
| 2 | 11 | 34.214 |
| 3 | 9 | 34.612 |
| 4 | 8 | 35.019 |
| 5 | 7 | 35.435 |
| 6 | 6 | 35.862 |
| 7 | 5 | 36.299 |
| 8 | 4 | 36.747 |
| 9 | 3 | 37.206 |
| 10 | 2 | 37.677 |
| 11 | 13+ | 38.160 |
| 12 | 13− | 36.655 |
| 13 | 15 | 39.163 |
| 14 | 16 | 39.685 |
| 15 | 17 | 40.221 |
| 16 | 18 | 40.771 |
| 17 | 19 | 41.338 |
| 18 | 20 | 41.919 |
| 19 | 21 | 42.518 |
| 20 | 14 | 43.134 |

Because in the examples described here only 9 commands are needed, only the outputs 2–9 and 11 are connected, while output 12 is coupled to ground. These 9 commands are represented by the command frequencies. The signal for the group frequencies appear at outputs 14 to 21. Thus, eight different receivers in all can be operated independently of each other, each receiver having its own group freqency. The corresponding correlation of the decoding module outputs to the group frequencies can be seen from the following table:

| | Frequency (kHz) | Output |
| --- | --- | --- |
| Receiver A | 43.134 | 14 |
| Receiver B | 42.518 | 21 |
| Receiver C | 41.919 | 20 |
| Receiver D | 41.338 | 19 |
| Receiver E | 40.771 | 18 |
| Receiver F | 40.221 | 17 |
| Receiver G | 39.685 | 16 |
| Receiver H | 39.163 | 15 |

Figure 2:
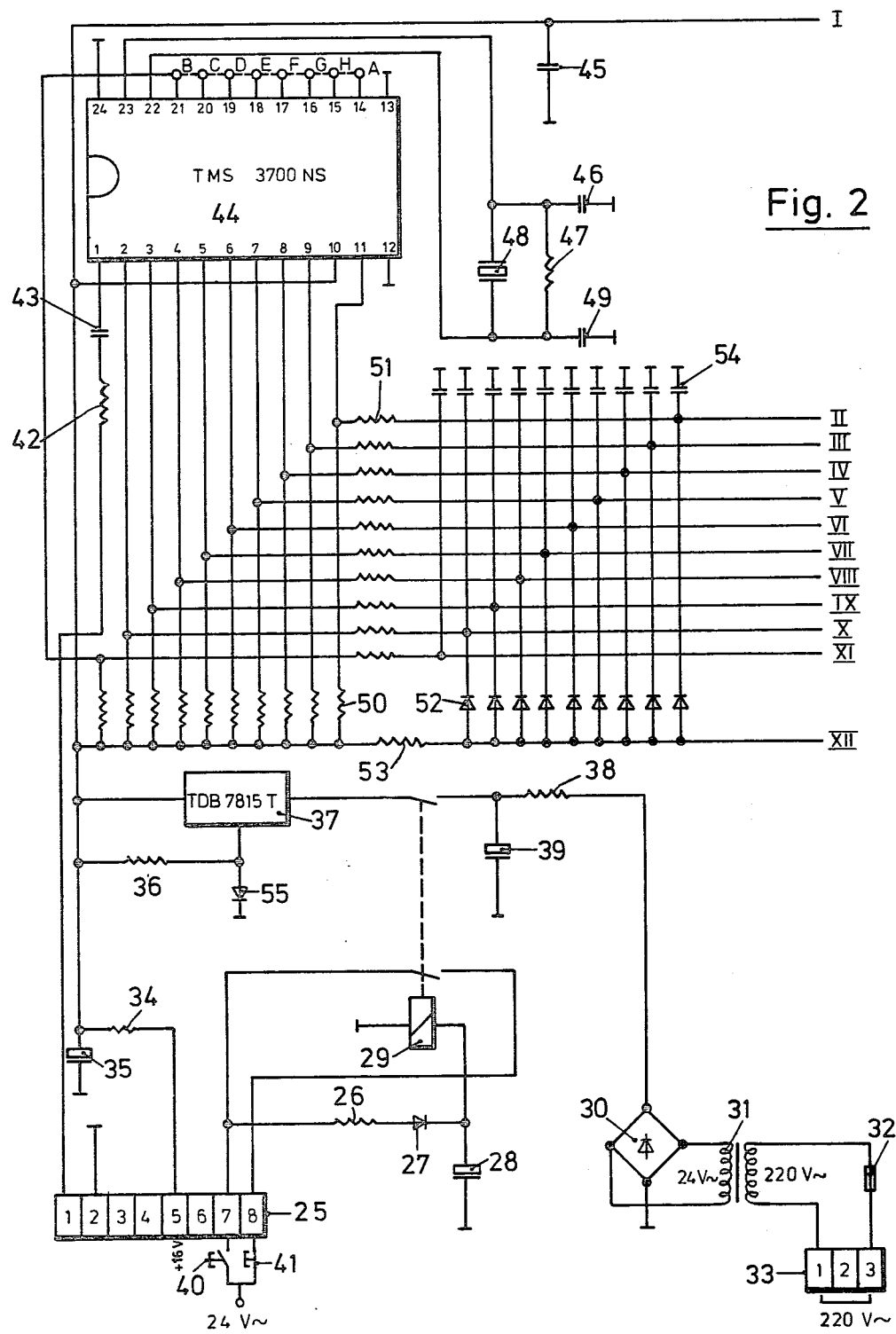
FIG. 2 shows a circuit diagram of a portion of the receiver including the signal decoding unit.
Figure 3:
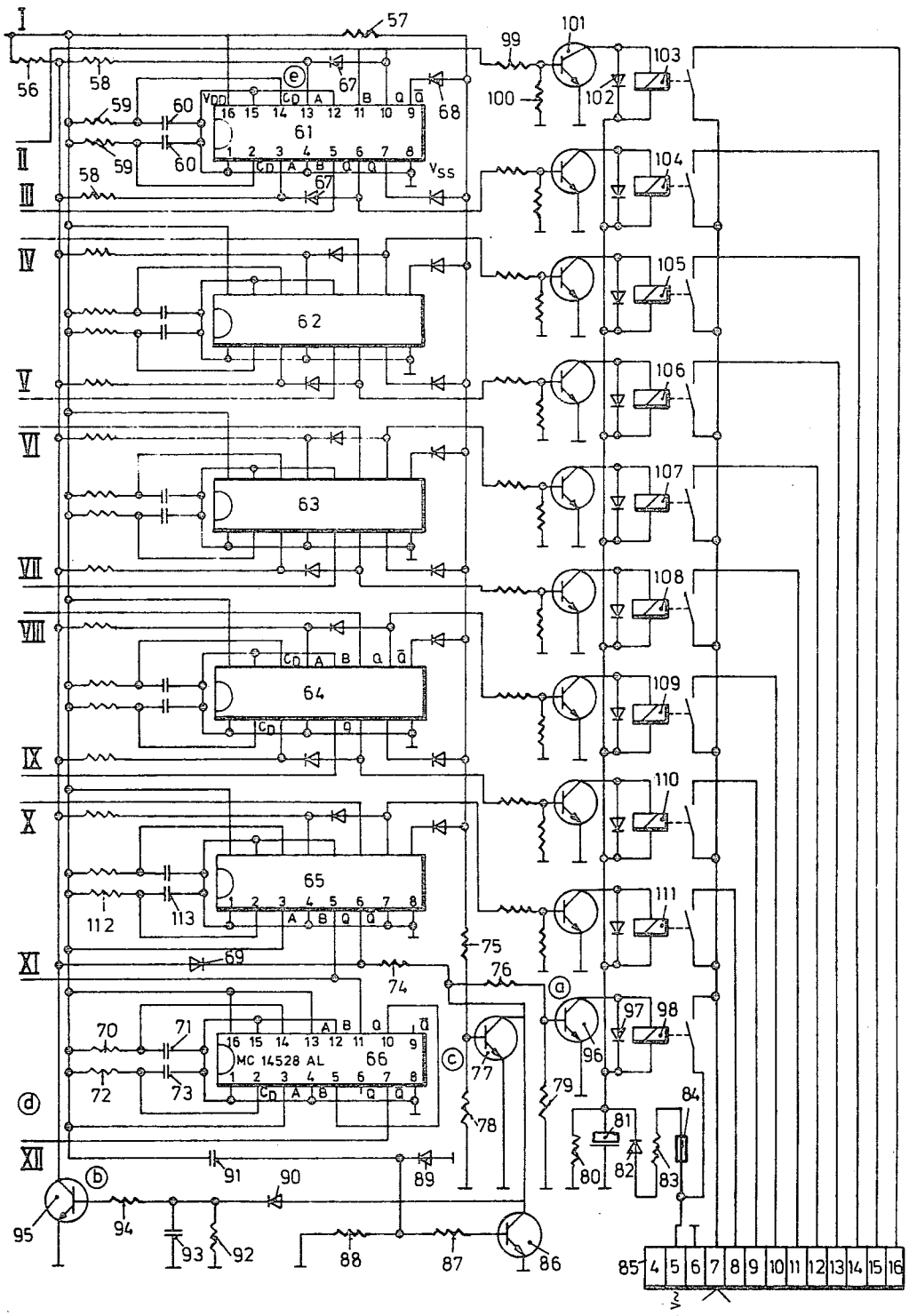
FIG. 3 shows a circuit diagram of a further portion of the receiver including the command register.

When a frequency is received, the respective output of the decoding unit 44 switches to ground. To obtain defined output levels, the output for the group frequency and the outputs of the command freqencies are coupled to supply voltage over a series of highly resistive resistors 50. In addition, each of these outputs is connected to a monostable sweep circuit of the command register by a compensating resistance 51. The command signal connections are labelled as II–X and the group signal connection as XI in FIG. 2. Each of these connections is coupled to ground by a blocking capacitor 54, and connections II–X are coupled to connection XII by a diode 52. Connection XII leads to the output of the monostable sweep circuit which is responsible for the group frequency and which is coupled to supply voltage by a resistor 53. The connection XI also has a blocking capacitor 54 coupled to ground, but no diode, because the signals for the group frequency are carried on this connection. In this embodiment, the group frequency is transmitted as a first frequency which opens a gate circuit for the command frequency by means of a time window circuit during the second half of the transmitting period. This gate circuit is formed by diodes 52. The exact function is explained in detail below. Supply voltage is led over connection I into the register shown in FIG. 3. This supply voltage is, as can be seen in FIG. 2, coupled to ground by a further filter condensor 45.

The register is formed of retriggerable monostable sweep circuits 61–66. These circuits are characterized in that they can be retriggered while in triggered condition such that the duration of the output pulse is determined by the last input trigger pulse. Two sweep circuits are provided in each of units 61 to 66. The first sweep circuit of each of units 61–65 serves as a command register for the storage of the command signals, the second sweep circuit of the unit 65 and both sweep circuits of unit 66 serve for storage of the group frequency and for the locking circuit which will be described in detail below. To simplify the description of the command signal register, only the wiring of unit 61 is described in detail. The remaining sweep circuits for the command signals are arranged correspondingly.

The supply voltage is provided from connection I to terminal unit 61. Terminals 1, 8, and 15, as well as the unused inputs 4 and 12 of the sweep stage are coupled to ground. The output pulse duration is essentially a function of the time constant determined by resistor 59 and capacitor 60. The signals for the command frequencies are supplied through connections II–X to the B-inputs of the sweep circuits (terminals 5 and 11 of unit 61). The sweep circuit is set only when the trigger input $C_D$ is provided with positive voltage. For this purpose, each $C_D$ input (terminals 3 and 13 of unit 61) is coupled to the supply voltage by a resistor 58 and a working resistor 56 for the transistor 95. In addition, the $C_D$ input is connected with the Q output by a decoupling diode, the anode of the diode connected to the Q output and the cathode to the $C_D$ input.

The Q output is further coupled to the base of switching transistor 101 by a compensating resistance 99. Because 9 commands are needed in all, 9 switching transistors 101 are provided. The base of each switching transistor is coupled to ground by a resistor 100. The emitter of switching transistor 101 is also coupled to ground. The collector is connected to one terminal of the coil of a relay 103, which operates as a first command implementing element. The other terminal of the coil is connected in parallel with the corresponding terminals of the remaining eight relays 104–111. These outputs are supplied with 24 V alternating voltage from junction 5 of junction block 85. This goes from junction 5 over a security fuse 84, a protection resistor 83, and a rectifier diode to these parallel-connected terminals. Capacitor 81 coupled from these outputs to ground serves for filtering. A resistor 80 is connected in parallel with this capacitor and serves as a discharging resistor when the receiver is switched off. Also connected in parallel with the terminals of relays 103–111 is a terminal of relay 98, which is designated as group relay and acts as a second controlling element, and which is only energized for enabling the command-implementing elements 103–11 when the group frequency and the command frequency have been received. The contacts of relay 98 are connected in series with a common pole of the contacts of relays 103–11. This means that only when the group relay is energized will the alternating voltage coming from junction 5 be supplied to the parallelconnected contacts of the other relays. Junction 7 serves to indicate the functioning of the receiver. The corresponding commands resulting from operation of the receiver are taken from junctions 8—16 of the junction block. Thyristors or triacs can be used in place of the relays 103-111 as command-implementing elements.

To keep the harmful induction voltages, which develop when the relay coils are switched off, away from the switching transistors, all coils of the relays 98 and 103 to 111 are connected in parallel with respective diodes 102 or 97. The signal for the group frequency is supplied to the B-inputs of the second sweep circuit of the unit 66 over connection XI. The time constant for the second sweep circuit of unit 65 is determined by the resistor 112 and the capacitor 113. The Q output of the second sweep circuit of unit 65 is supplied to the base of switching transistor 96 through resistors 74 and 76. The corresponding signal is designated as a in FIG. 4 of the pulse diagram. The base of this switching transistor is coupled to ground by resistor 79. If the base receives a positive bias voltage, transistor 96 is forward-biased and becomes conductive, and group relay 98 is energized such that, as already described, the 24 V alternating voltage is supplied to the contacts of relays 103-11. This has been provided for security reasons, to ensure that a command will be performed only upon receipt of a command signal and a group signal.

Figure 4:
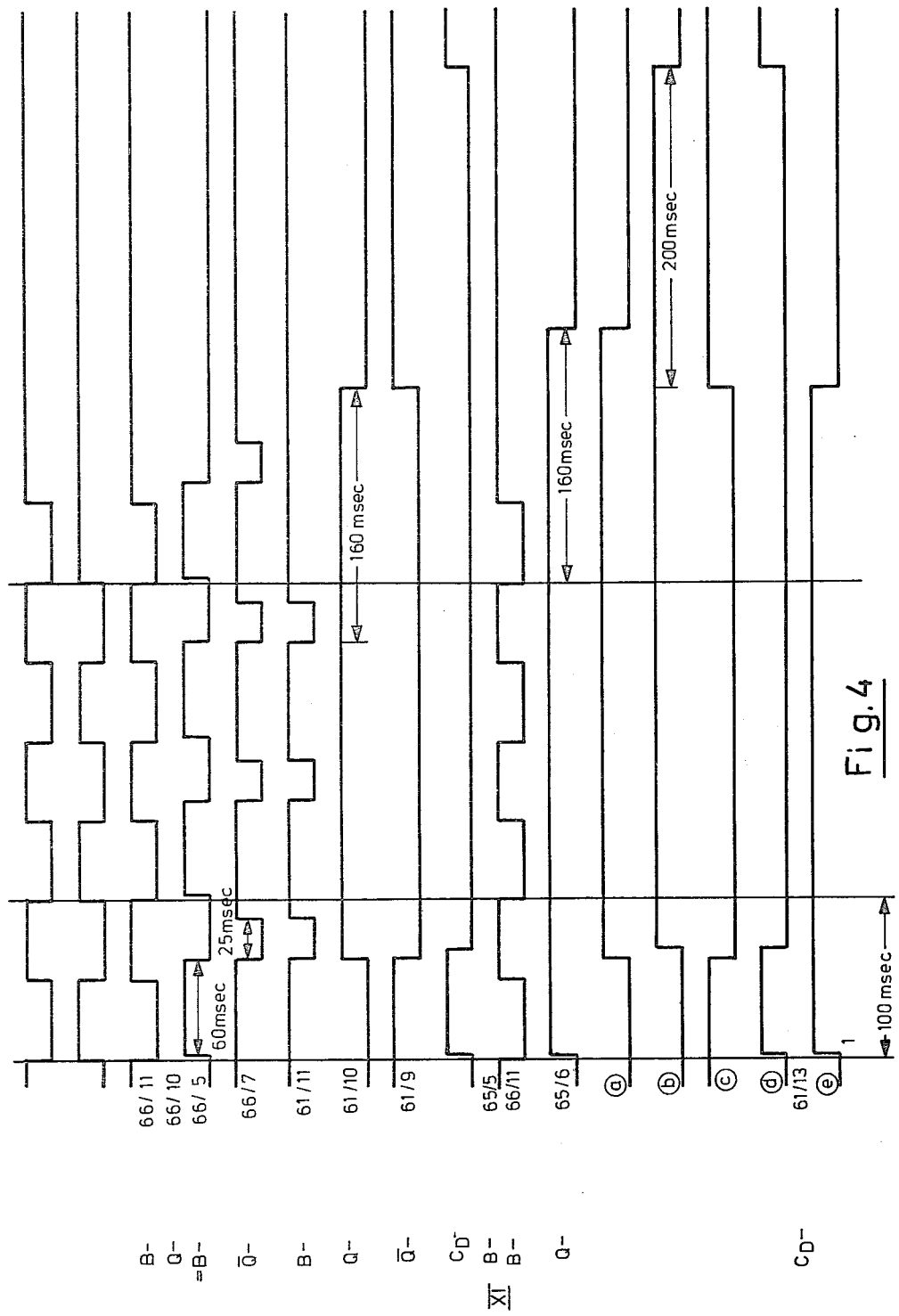
FIG. 4 shows a pulse diagram of the receiver.

Unit 66, with its two sweep circuits, forms the time window. Output Q of the first sweep circuit is supplied from terminal 10 of the unit to the B-input of the sweep circuit which corresponds to terminal 5 of unit 66. Output Q of the second sweep circuit of unit 66 is supplied over connection XII to the gate circuit formed by the series of diodes 52. The respective time constants for the sweep circuits are determined by resistors 70 and 72 and the capacitors 71 and 73. The corresponding pulses are shown in the diagram of FIG. 4. The complementary outputs $\overline{Q}$ of the command register (units 61-64 and 65, first sweep circuit) are connected together in the form of a NAND-gate. The $\overline{Q}$ outputs are coupled to supply voltage over respective parallel connected diodes as well as over a resistor 57, and are connected further over a resistor 75 to the base of a transistor 77. This base is further coupled to ground by a resistor 78. The emitter of transistor 77 is connected to ground, while the collector is connected by resistor 74 with the Q-output of the second sweep circuit of unit 65. From the collector of transistor 77 exists a connection to a further transistor 86, the base of which is coupled to ground by resistors 87 and 88. Also connected to ground is the emitter of transistor 86. The collectors of transistors 77 and 86 are coupled to the base of a transistor 95 by a diode 90 and a resistor 94 in series, while the emitter of transistor 95 is connected to ground. The collector of transistor 95 is connected with the $C_D$ inputs of the sweep circuits of the command register by a resistance network which consists of parallel-connected resistors 58 and the resistor 56. The collector is further coupled to the Q output of the second sweep circuit of unit 65 by a diode 69. A connection to the supply voltage and to the RC-members of units 61-66 determining the time duration is provided from resistor 87 through a capacitor 91, as well as to the $C_D$ inputs of unit 66 and the second sweep circuit of unit 65. A diode 89 is further provided, the anode of which is connected to ground and the cathode of which is connected with the junction of capacitor 91 and resistors 87 and 88. Another resistor 92 and a capacitor 93 couple the junction of diode 90 and resistor 94 to ground.

If now the receiver is provided with supply voltage, all sweep circuits operate with their own time constants. This would lead to false operations. To prevent this, the transistor 96 and its associated group relay 98 must be blocked. This happens in that the base of transistor 86 receives a short positive voltage pulse when capacitor 91 is charged through resistor 88, and therefore the base of transistor 96 is coupled to ground such that the transistor 96 is blocked during the switching-ON phase of the supply voltage. If now the supply voltage is briefly interrupted, the capacitor 91 must first discharge through resistor 88 with a determined time constant. During this discharging time, the switching-ON suppression provide by the transistor 86 would not be effective. Diode 89 is provided to avoid this disadvantage, the diode being blocked during charging of the capacitor 91. Thus, if the supply voltage is switched-off, the side of the condenser 91 which was previously charged to positive potential is coupled to ground potential over the remaining circuit. Therefore, the side charged previously to negative potential appears negative relative to ground such that diode 89 becomes conductive. The condensor is discharged very quickly so that the switching-ON suppression can become effective again immediately.

In the example given here, a remote control signal transmission cycle of 100 msec. is assumed. This means that during the first 50 msec. a group frequency pulse is transmitted and during the second 50 msec. a command frequency pulse is transmitted. If now a group frequency is transmitted which the decoding module 44 recognizes as its own, a pulse as shown in FIG. 4 is provided over connection XI to the B inputs of the units 65 (terminal 5) and 66 (terminal 11). The time constant of the first sweep circuit of unit 66 is set to be 60 msec. If this sweep circuit is operated, a pulse (66/10) appears at the Q output (output 10) for a duration of 60 msec. This pulse is supplied to the B input (terminal 5) of the second sweep circuit of unit 66. Because this time constant is set to be 25 msec., a pulse appearing at the $\overline{Q}$ output (terminal 7) switches from positive voltage (level H) to negative voltage (level L). After a duration of 25 msec., the $\overline{Q}$ output returns to level H again. This pulse (66/7) is supplied to the series of diodes 52 over connection XII. As long as this Q output is at level H, the diodes are conductive and the command signal outputs of the decoding module 44 are held at positive potential such that they are blocked. But if the pulse level L appears, the diodes are then blocked and the pulses representing a command signal can pass the gate circuit.

As long as no command signals have been taken into the command register, the $\overline{Q}$ outputs are at level H. The base of transistor 77 is at positive potential such that the transistor is conductive. With that, the base of transistor 95 at point b is at ground potantial. Point d and therefore $C_D$ inputs of the command register are at level H. This means that the sweep circuits are ready to receive the pulse for the command frequency. Point b and therefore also point a represent the output of a type of AND-gate which consists of the output Q (65/6) of the second sweep circuit of unit 65 and of the AND-gate consisting of the diodes 68 and of the transistor 77. This means that only if both outputs are at level H will the transistor be rendered conductive and the group relay 98 energized.

It is assumed in the following that the command signal is received as a pulse on connection I. The levels at the inputs and outputs of the respective sweep circuits are shown in FIG. 4 as 61/11. 61/9, respectively. As soon as the sweep circuit is operated, output $\overline{Q}$ is at level L. Thus, point c is also at level L and the transistor 77 is nonconductive. Because output 65/6 is at level H, point b is also at level H. Transistor 95 is forward biased and rendered conductive and the $C_D$ inputs of the sweep circuits not operated are coupled to ground such that the B inputs are blocked. The Q outputs of the sweep circuits not operated are also coupled to ground. The Q output (61/10) of the operated sweep circuit provides level H such that the diode 67 is conductive and the $C_D$ input is held at level H. At the same time, point a is also at level H such that, because a group signal and a command signal have been received, the group relay 98 is energized. The relay 103 also is energized through forward-biased, and hence conductive, transistor 101 such that the command will be implemented.

The time constant for the second sweep circuit of unit 65 is fixed at 160 msec. Because the sweep circuits are retriggerable sweep circuits, a retriggering occurs with each new reception of the group frequency. As can be seen from pulse 65/6 of FIG. 4, the output of the sweep stage decreases to level L 160 msec. after the last received pulse of the group frequency. After the signal of the command frequency has operated the corresponding sweep circuit, point b goes to level H. With that, condensor 93 is charged to positive potential with a determined time constant. If now the respective sweep stage decreases 160 msec. after reception of the last frequency, point c goes again to level H, such that transistor 77 becomes conductive and the collector goes almost to ground potential. Because condensor 93 is charged with positive potential, diode 90 is blocked. Transistor 95 remains forward-biased such that poind d remains at ground potential and therefore all $C_D$ inputs of the command register remain blocked. Now a discharge of capacitor 93 takes place wherein the time duration depends upon the size of capacitor 93 and of the two resistors 92 and 94. In this example, the duration is set at 200 msec.

Consequently, the $C_D$ inputs of the command register stay blocked for a total of 360 msec. after reception of the last command frequency. The Q output 65/6 of the second sweep circuit of unit 65 is coupled to the collector of transistor 77 by resistor 74. If none of the sweep circuits is operated, the Q output 65/6 is at level L. The $\bar{Q}$ outputs of the command register are at level H. Consequently, transistor 77 is forward-biased and point b is at level L. The diode 69 transfers level L from the Q output 65/6 to point d, such that all sweep circuits of the command register are blocked at the $C_D$ inputs. Only after the second sweep circuit of unit 65 is operated by the group signal are all sweep circuits of the command register ready to receive the command signal which has passed the gate circuit. If a command signal is recognized, all other sweep circuits of the command register are immediately blocked by the locking circuit.

Although the described embodiment provides for the use of ultrasonic as transmission means, the concept of the invention can, of course, also be realized with electromagnetic waves, for example, infrared waves.

We claim:

1. Apparatus for receiving remote control signals having an alternating sequence of two chronologically successive frequency pulses, the first said pulse having a first predetermined frequency and the second said pulse having a second frequency manually selected from a predetermined number of frequencies, each of said predetermined number of frequencies representing a respective command to be carried out, the apparatus comprising:
   means for detecting said remote control signal;
   means coupled to the output of said detecting means for selectively amplifying said remote control signal;
   means coupled to the output of said amplifying means for decoding said remote control signal into a group signal dependent on said first frequency and a command signal dependent on said second frequency;
   controllable means for gating said command signal from said decoding means to command-signal registering means;
   means for registering the command signal from said decoding means, said registering means having a command-signal input and a command-signal output for each of the predetermined number of commands and a blocking input for each command-signal output;
   means coupled to each said command-signal output for implementing the corresponding command;
   circuit means responsive to said group signal and coupled for controlling said gate means to allow passage of said command signal to said command-signal registering means; and
   circuit means responsive to receipt of a command signal at one of said command-signal inputs for locking the remaining command-signal inputs by supplying a signal to the corresponding blocking inputs.

2. The apparatus of claim 1, wherein said locking circuit means further comprises means responsive to said group signal for inhibiting said command-implementing means when said first frequency signal has not been detected and decoded into a group signal, and for enabling said implementing means when said first frequency has been detected and decoded into a group signal.

3. The apparatus of claim 2, wherein said inhibiting and enabling means comprises a switch connected for providing a supply voltage to said implementing means when enabled and for disconnecting said supply voltage when inhibited.

4. The apparatus of claim 2, wherein said command-signal registering means comprises a plurality of retriggerable, monostable sweep circuits, each having a said command-signal input, a said command-signal output, and a said blocking input.

5. The apparatus of claim 4, wherein each said sweep circuit further includes a complementary command-signal output and said locking circuit means comprises a NAND-gate having a respective input coupled to each said complementary command-signal output and having an output, and an electronic switch having an input coupled to the output of said NAND-gate and an output coupled to said blocking inputs.

6. The apparatus of claim 5, wherein the output of said NAND-gate is coupled to the input of said electronic switch by a voltage stabilizing circuit.

7. The apparatus of claim 6, wherein said voltage stabilizing circuit comprises a diode having one terminal connected to the output of said NAND-gate, and the other terminal coupled by a resistor to the input of said electronic switch and by a parallel-connected resistor and capacitor to ground.

8. The apparatus of claim 6, wherein said NAND-gate comprises a plurality of diodes, each diode having a cathode connected to a respective said complementary command-signal output and an anode coupled by a resistor to supply voltage; and a transistor having a base coupled by a resistor to the anodes of said diodes and having a collector coupled to said voltage stabilizing circuit.

9. The apparatus of claim 8, further comprising a further retriggerable, monostable sweep circuit having an input coupled to receive said group signal and an output coupled to the collector of said NAND-gate transistor.

10. The apparatus of claim 9, wherein the output of said further retriggerable, monostable sweep circuit is coupled to the collector of said NAND-gate transistor by a resistor.

11. The apparatus of claim 9, wherein the output of said retriggerable, monostable sweep circuit is coupled to an input of said inhibiting and enabling means.

12. The apparatus of claim 5, wherein said electronic switch comprises a transistor having a base coupled to the output of said NAND-gate, an emitter coupled to ground, and a collector coupled by a resistor to supply voltage and by a respective resistor to each said blocking input of said command-signal registering means.

13. The apparatus of claim 1, wherein each said command-signal output is coupled by a diode to the corresponding blocking input, whereby a command signal appearing at said command-signal output prevents the corresponding blocking input from receiving said signal from said locking circuit means.

14. The apparatus of claim 1, wherein each said implementing means comprises a relay, and a switching transistor coupled to a command-signal output for activating said relay in response to a command signal.

15. The apparatus of claim 1, wherein each said implementing means comprises a thyristor.

16. The apparatus of claim 1, wherein each said implementing means comprises a triac.

17. The apparatus of claim 6, wherein said voltage stabilizing circuit has a predetermined discharge-time parameter at least equal to one said alternating sequence of received first and second frequencies, whereby said electronic switch will provide a signal to said blocking inputs in case of short-term signal interruption and at the end of the received pulse sequence.

* * * * *